United States Patent
Yang et al.

(10) Patent No.: US 11,380,871 B2
(45) Date of Patent: Jul. 5, 2022

(54) DISPLAY DEVICE INCLUDING SEALING LAYERS HAVING OPTIMIZED WETTABILITY

(71) Applicant: SHARP KABUSHIKI KAISHA, Sakai (JP)

(72) Inventors: Yixin Yang, Sakai (JP); Yoshifumi Ohta, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 165 days.

(21) Appl. No.: 16/975,006

(22) PCT Filed: Feb. 26, 2018

(86) PCT No.: PCT/JP2018/007015
§ 371 (c)(1),
(2) Date: Aug. 21, 2020

(87) PCT Pub. No.: WO2019/163134
PCT Pub. Date: Aug. 29, 2019

(65) Prior Publication Data
US 2020/0403182 A1    Dec. 24, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3276* (2013.01); *H01L 51/524* (2013.01); *H01L 51/56* (2013.01); *H01L 2251/301* (2013.01)

(58) Field of Classification Search
CPC .............. H01L 51/5253; H01L 51/524; H01L 51/5246; H01L 51/5243; H01L 51/5237; H01L 51/5256; H01L 51/56; H01L 27/3276
USPC .......................................................... 257/40
See application file for complete search history.

(56) References Cited

U.S. PATENT DOCUMENTS

| 2014/0117330 A1* | 5/2014 | Cho ..................... H01L 51/5256 257/40 |
| 2019/0198782 A1* | 6/2019 | Kim ..................... H01L 27/1248 |
| 2019/0363145 A1* | 11/2019 | Ohta ................... H01L 27/3276 |

FOREIGN PATENT DOCUMENTS

| CN | 107507931 A | * 12/2017 | ......... H01L 51/5253 |
| CN | 108832022 A | * 11/2018 | ........... H01L 51/525 |
| JP | 2014-086415 A | 5/2014 | |

* cited by examiner

*Primary Examiner* — Matthew E. Gordon
(74) *Attorney, Agent, or Firm* — ScienBiziP, P.C.

(57) ABSTRACT

A display device includes: a base substrate having a display area and a frame area, the display area to display an image, the frame area surrounding the display area; a light-emitting element in the display area; and a sealing film provided in the display area and the frame area so as to cover the light-emitting element, the sealing film including a first inorganic film, an organic film, and a second inorganic film, wherein the first inorganic film covers the light-emitting element, a third inorganic film is provided between the first inorganic film and the organic film, the third inorganic film having higher wettability for a liquid drop, the organic film on the first inorganic film covers the third inorganic film, and the second inorganic film covers the peripheral end portion of the first inorganic film and the organic film.

12 Claims, 10 Drawing Sheets

DISPLAY DEVICE INCLUDING SEALING LAYERS HAVING OPTIMIZED WETTABILITY

TECHNICAL FIELD

The disclosure relates to display devices and methods of manufacturing the display devices.

BACKGROUND ART

The OLED display device, or the self-luminous display device built around OLEDs (organic light-emitting diodes), has been attracting attention as an alternative to the liquid crystal display device. A sealing structure in which a sealing film covering the OLEDs is provided by a stack of organic and inorganic films is suggested for the OLED display device to prevent degradation of the OLEDs due to contamination by, for example, water and oxygen.

For instance, Patent Literature 1 discloses a display device including: a layered structure in which inorganic film layers formed, for example, by CVD (chemical vapor deposition) and organic film layers formed, for example, by inkjet technology are alternately provided; and a thin film sealing layer covering the organic light-emitting elements.

CITATION LIST

Patent Literature

Patent Literature 1: Japanese Unexamined Patent Application Publication, Tokukai, No. 2014-86415

SUMMARY OF INVENTION

Technical Problem

When the organic films in the sealing film are formed by inkjet technology as in the display device disclosed in Patent Literature 1, it is difficult to accurately form the peripheral end portion of the organic films because the liquid drops of organic resin materials for the organic films easily spread to the surroundings.

In view of the foregoing problems, it is an object of the disclosure to accurately form the peripheral end portion of an organic film in the sealing film.

Solution to Problem

To achieve the object, the disclosure is directed to a display device including: a base substrate having designated a display area and a frame area, the display area being configured to display an image, the frame area surrounding the display area; a light-emitting element in the display area of the base substrate; and a sealing film provided in the display area and the frame area so as to cover the light-emitting element, the sealing film including a sequential stack of a first inorganic film, an organic film, and a second inorganic film, wherein the first inorganic film is provided so as to cover the light-emitting element, the display device further includes a third inorganic film between the first inorganic film and the organic film, the third inorganic film having higher wettability for a liquid drop that is to form the organic film than does the first inorganic film and having a peripheral end portion located on a display area side of a peripheral end portion of the first inorganic film and on an opposite side of a peripheral end portion of the light-emitting element from the display area, the organic film is provided on the first inorganic film so as to cover the third inorganic film, and the second inorganic film is provided so as to cover the peripheral end portion of the first inorganic film and to cover the organic film.

Advantageous Effects of Invention

The disclosure provides a third inorganic film between the first inorganic film and the organic film, the third inorganic film having higher wettability for a liquid drop that is to form the organic film than does the first inorganic film and having a peripheral end portion located on a display area side of a peripheral end portion of the first inorganic film and on an opposite side of a peripheral end portion of the light-emitting element from the display area. The disclosure therefore enables the peripheral end portion of an organic film in the sealing film to be formed accurately.

DESCRIPTION OF EMBODIMENTS

The following will describe embodiments of the disclosure in detail with reference to drawings. The disclosure is by no means limited to these embodiments.

First Embodiment

Figure 1:
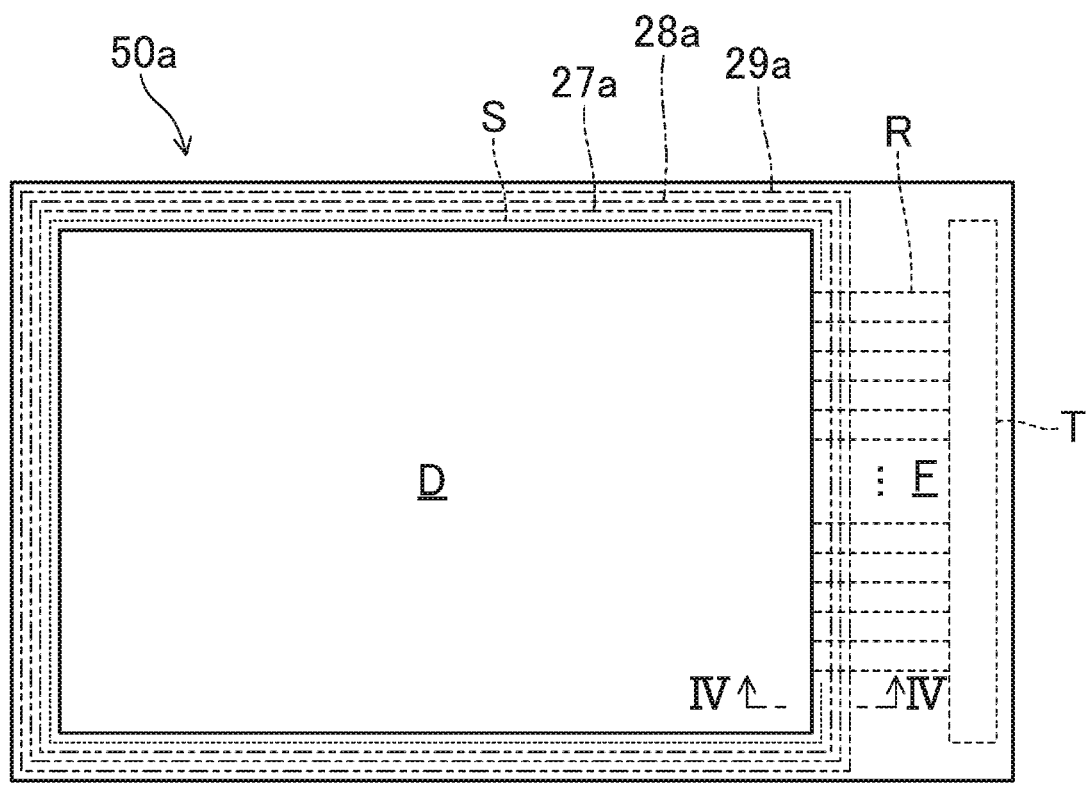
FIG. 1 is a schematic plan view of a structure of an OLED display device in accordance with a first embodiment of the disclosure.
Figure 2:
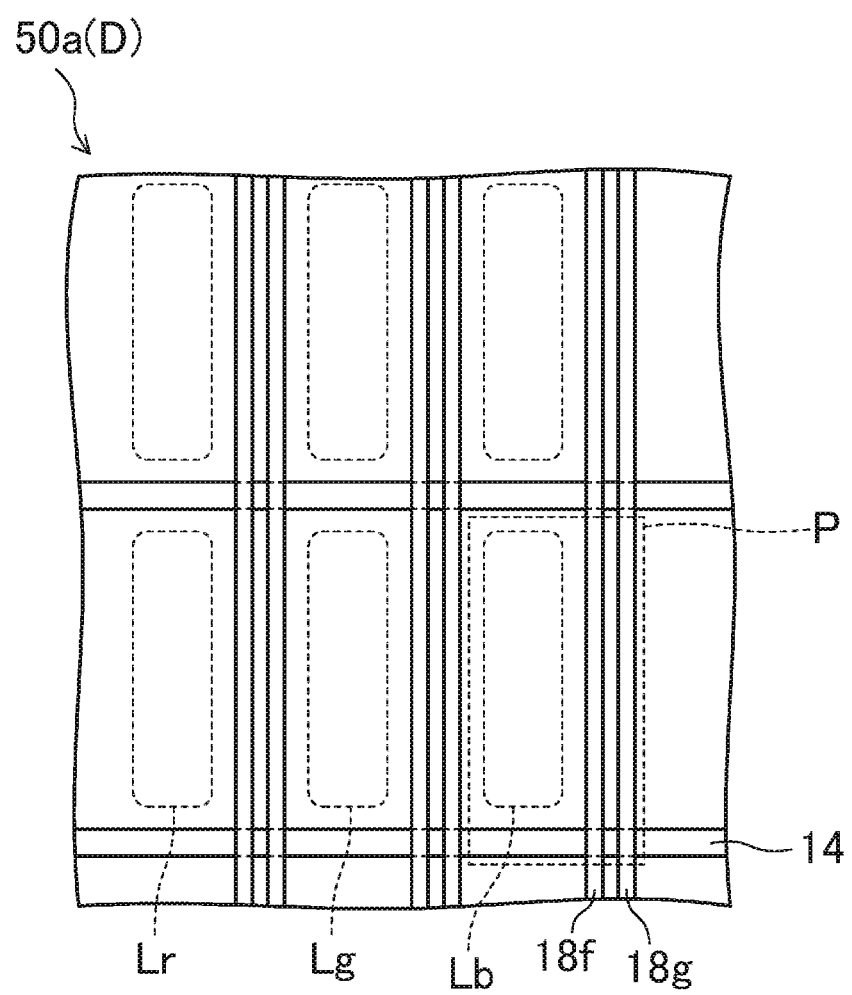
FIG. 2 is a plan view of a display area of the OLED display device in accordance with the first embodiment of the disclosure.
Figure 3:
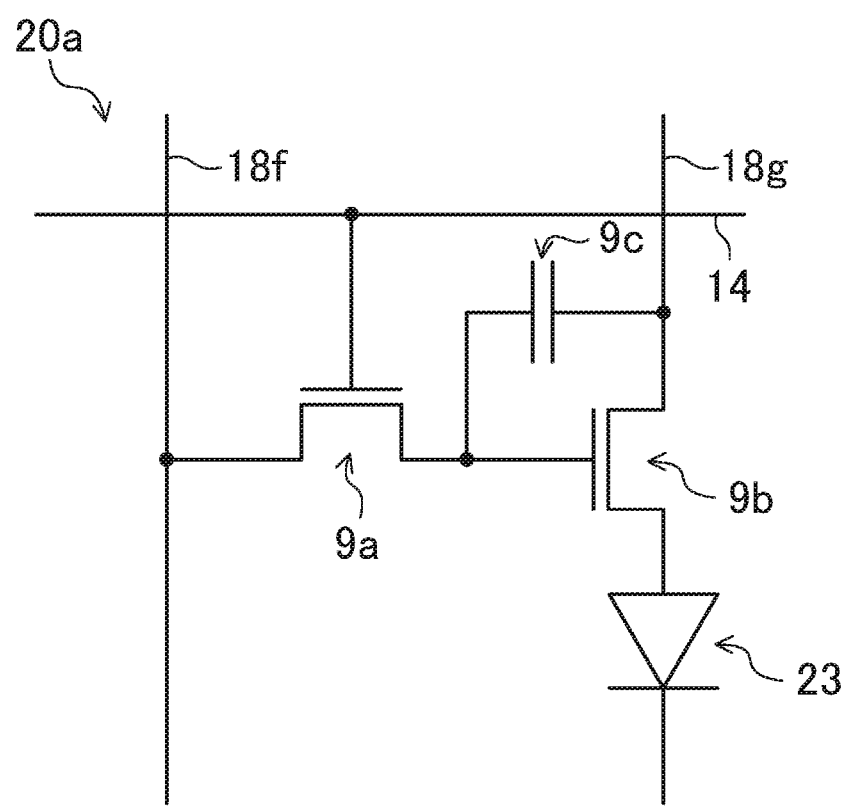
FIG. 3 is an equivalent circuit diagram of a TFT layer in the OLED display device in accordance with the first embodiment of the disclosure.
Figure 4:
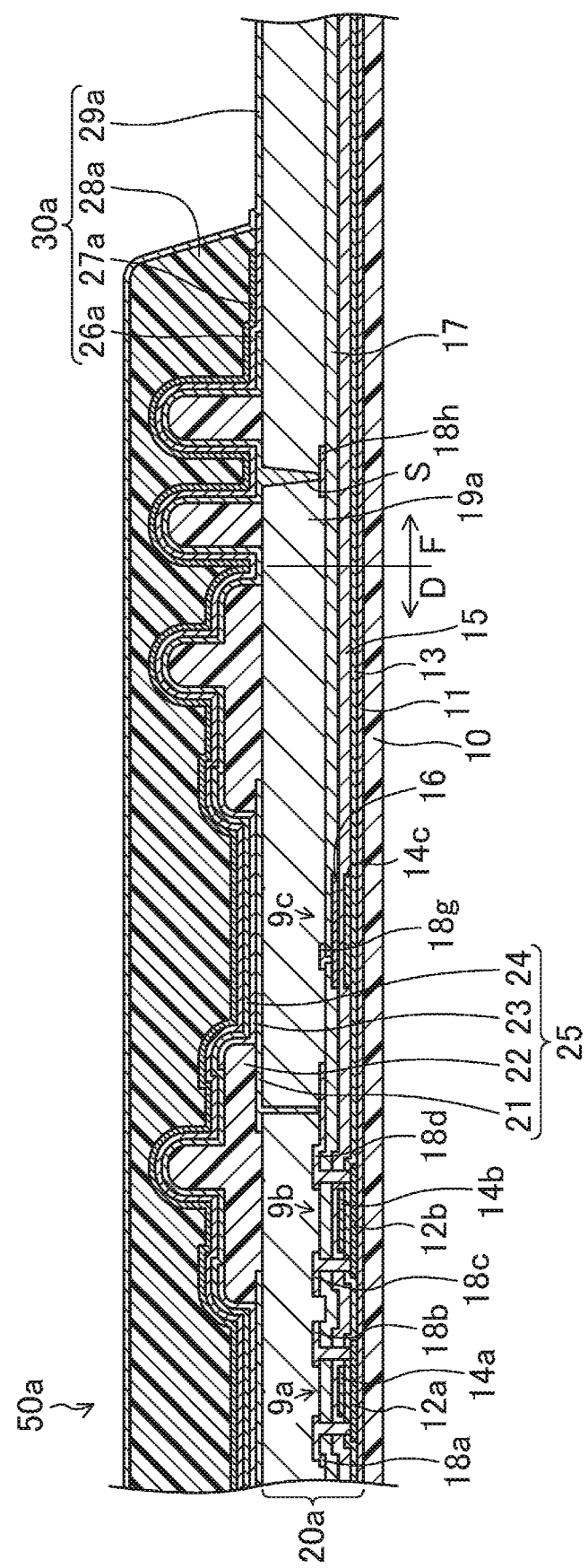
FIG. 4 is a cross-sectional view of the OLED display device taken along line IV-IV shown in FIG. 1.
Figure 5:
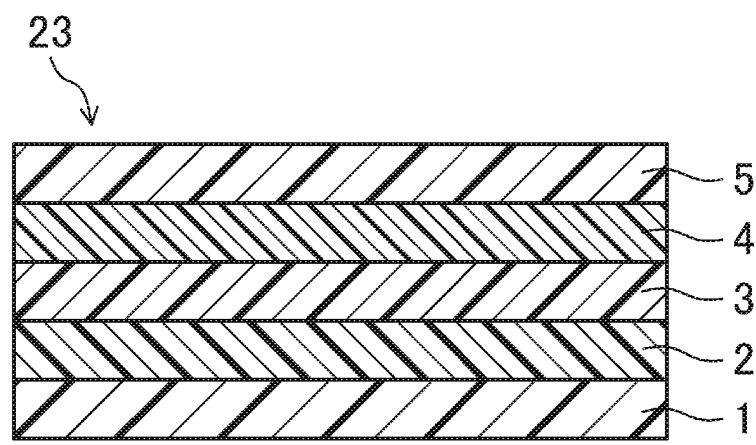
FIG. 5 is a cross-sectional view of an organic light-emitting layer in the OLED display device in accordance with the first embodiment of the disclosure.
Figure 6:
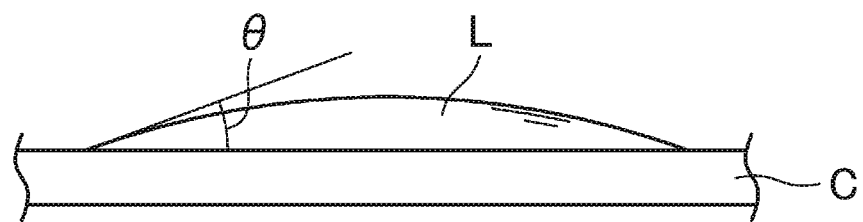
FIG. 6 is a schematic drawing illustrating the wettability of a liquid drop that will form an organic film in a sealing film in the OLED display device in accordance with the first embodiment of the disclosure.

FIGS. 1 to 6 illustrate a first embodiment of the display device and the method of manufacturing the display device in accordance with the disclosure. This and subsequent embodiments will discuss OLED display devices including OLEDs as an example of the display device including light-emitting elements. FIG. 1 is a schematic plan view of a structure of an OLED display device 50*a* in accordance with the present embodiment. FIG. 2 is a plan view of a display area D of the OLED display device 50*a*. FIG. 3 is an equivalent circuit diagram of a TFT layer 20*a* in the OLED display device 50*a*. FIG. 4 is a cross-sectional view of the OLED display device 50*a* taken along line IV-IV shown in FIG. 1. FIG. 5 is a cross-sectional view of an organic light-emitting layer 23 in the OLED display device 50*a*. FIG. 6 is a schematic drawing illustrating the wettability of a liquid drop L that will form an organic film 28*a* in a sealing film 30*a* in the OLED display device 50*a*.

The OLED display device 50*a*, as shown in FIG. 1, includes, for example, the rectangular display area D for displaying an image and a frame area F surrounding the display area D. In the display area D of the OLED display device 50*a* is there provided a matrix of subpixels P as shown in FIG. 2. In the display area D of the OLED display device 50*a*, a subpixel P including a red-light-emitting region Lr for a grayscale display in red, a subpixel P including a green-light-emitting region Lg for a grayscale display in green, and a subpixel P including a blue-light-emitting region Lb for a grayscale display in blue are provided adjacent to each other as shown in FIG. 2. Each pixel in the display area D of the OLED display device 50*a* is formed by three adjacent subpixels P including a red-light-emitting region Lr, a green-light-emitting region Lg, and a blue-light-emitting region Lb respectively. As shown in FIG. 1, the frame area F has a terminal region T on the right-hand side of the display area D in the figure. There is provided a plurality of routing lines R in the frame area F between the display area D and the terminal region T as shown in FIG. 1. The routing lines R are extended parallel to each other in the lateral direction in the figure. The present embodiment describes the display area D as being rectangular as an example. Alternatively, the display area D may be circular or have any other shape.

The OLED display device 50*a*, as shown in FIG. 4, includes a resin substrate layer 10, the TFT (thin film transistor) layer 20*a*, OLEDs 25, and the sealing film 30*a*. The resin substrate layer 10 serves as a base substrate. The TFT layer 20*a* is provided on the resin substrate layer 10. The OLEDs 25 are light-emitting elements on the TFT layer 20*a*. The sealing film 30*a* is provided so as to cover the OLEDs 25.

The resin substrate layer 10 is made of, for example, polyimide resin.

The TFT layer 20*a* includes: a base coat film 11 on the resin substrate layer 10; a plurality of first TFTs 9*a*, a plurality of second TFTs 9*b*, and a plurality of capacitors 9*c* on the base coat film 11; and a planarization film 19*a* on the first TFTs 9*a*, the second TFTs 9*b*, and the capacitors 9*c*, as shown in FIG. 4. The TFT layer 20*a* includes therein a plurality of gate lines 14 extending parallel to each other in the lateral direction in the figure as shown in FIGS. 2 and 3. The TFT layer 20*a* further includes therein a plurality of source lines 18*f* extending parallel to each other in the vertical direction in the figure as shown in FIGS. 2 and 3. The TFT layer 20*a* further includes a plurality of power supply lines 18*g* extending adjacent to the source lines 18*f* and parallel to each other in the vertical direction in the figure as shown in FIGS. 2 and 3. The TFT layer 20*a* further includes the first TFTs 9*a*, the second TFTs 9*b*, and the capacitors 9*c*, one each in every subpixel P as shown in FIG. 3.

The base coat film 11 includes either a single inorganic insulating film of, for example, silicon nitride, silicon oxide, or silicon oxynitride or a stack of any of these inorganic insulating films.

Each first TFT 9*a* is connected to an associated one of the gate lines 14 and an associated one of the source lines 18*f* in the subpixel P as shown in FIG. 3. The first TFT 9*a* includes: a semiconductor layer 12*a* provided in an insular manner on the base coat film 11; a gate insulating film 13 provided so as to cover the semiconductor layer 12*a*; a gate electrode 14*a* provided on the gate insulating film 13 so as to overlap a channel region of the semiconductor layer 12*a* (not shown); a first interlayer insulating film 15 and a second interlayer insulating film 17 provided sequentially so as to cover the gate electrode 14*a*; and a source electrode 18*a* and a drain electrode 18*b* provided on the second interlayer insulating film 17 so as to be separated from each other, as shown in FIG. 4. The source electrode 18*a* and the drain electrode 18*b* are connected respectively to a source region (not shown) and a drain region (not shown) both in the semiconductor layer 12*a* via contact holes formed through the stack of the gate insulating film 13, the first interlayer insulating film 15, and the second interlayer insulating film 17. The gate insulating film 13, the first interlayer insulating film 15, and the second interlayer insulating film 17 each include either a single inorganic insulating film of, for example, silicon nitride, silicon oxide, or silicon oxynitride or a stack of any of these inorganic insulating films.

Each second TFT 9*b* is connected to an associated one of the first TFTs 9*a* and an associated one of the power supply lines 18*g* in the subpixel P as shown in FIG. 3. The second TFT 9*b* includes: a semiconductor layer 12*b* provided in an insular manner on the base coat film 11; the gate insulating film 13 provided so as to cover the semiconductor layer 12*b*; a gate electrode 14*b* provided on the gate insulating film 13 so as to overlap a channel region (not shown) of the semiconductor layer 12*b*; the first interlayer insulating film 15 and the second interlayer insulating film 17 provided sequentially so as to cover the gate electrode 14*b*; and a source electrode 18*c* and a drain electrode 18*d* provided on the second interlayer insulating film 17 so as to be separated from each other, as shown in FIG. 4. The source electrode 18*c* and the drain electrode 18*d* are connected respectively to a source region (not shown) and a drain region (not shown) both in the semiconductor layer 12*b* via contact holes formed through the stack of the gate insulating film 13, the first interlayer insulating film 15, and the second interlayer insulating film 17. The first TFTs 9*a* and the second TFTs 9*b* are described as being top-gate TFTs in the present embodiment, but may alternatively be bottom-gate TFTs.

Each capacitor 9*c* is connected to an associated one of the first TFTs 9*a* and an associated one of the power supply lines 18*g* in the subpixel P as shown in FIG. 3. The capacitor 9*c* includes: a lower conductive layer 14*c* formed of the same material and in the same layer as the gate electrodes 14*a* and 14*b*; the first interlayer insulating film 15 provided so as to cover the lower conductive layer 14*c*; and an upper conductive layer 16 provided on the first interlayer insulating film 15 so as to overlap the lower conductive layer 14*c*, as shown in FIG. 4. The upper conductive layer 16 is connected to the power supply lines 18*g* via contact holes formed through the second interlayer insulating film 17, as shown in FIG. 4.

The planarization film 19*a* is made of, for example, a colorless, transparent organic resin material such as polyimide resin. The planarization film 19*a* has a frame-shaped slit S surrounding the display area D in the frame area F as shown in FIGS. 1 and 4.

The OLEDs 25 are provided in the display area D of the resin substrate layer 10 via the TFT layer 20a as shown in FIG. 4 and include a plurality of first electrodes 21, an edge cover 22, a plurality of organic light-emitting layers 23, and a second electrode 24 provided sequentially on the planarization film 19a.

The first electrodes 21, one for each subpixel P, are provided as a matrix of anodes on the planarization film 19a as shown in FIG. 4. Each first electrode 21 is connected to the drain electrode 18d of the second TFT 9b via a contact hole formed through the planarization film 19a as shown in FIG. 4. The first electrodes 21 have a function of injecting holes to the organic light-emitting layer 23. The first electrodes 21 are preferably formed of a material that has a large work function in order to improve the efficiency of hole injection to the organic light-emitting layer 23. The first electrodes 21 are made of, for example, a metal material such as silver (Ag), aluminum (Al), vanadium (V), cobalt (Co), nickel (Ni), tungsten (W), gold (Au), titanium (Ti), yttrium (Y), manganese (Mn), or indium (In). The first electrodes 21 may be made of, for example, an electrically conductive oxide such as tin oxide (SnO), zinc oxide (ZnO), indium tin oxide (ITO), or indium zinc oxide (IZO). As another alternative, the first electrodes 21 may be a stack of layers of any of these materials. Examples of materials that have a large work function include indium tin oxide (ITO) and indium zinc oxide (IZO). As a further alternative, the first electrodes 21 may be a stack of any of these metal and oxide films.

The edge cover 22 is arranged to form a lattice covering the peripheral portions of the first electrodes 21 as shown in FIG. 4. The edge cover 22 is made of, for example, an organic film such as a film of polyimide resin, acrylic resin, polysiloxane resin, or novolac resin. Because the edge cover 22 has a convex shape as shown in FIG. 4, the OLED 25 has a non-flat surface. The edge cover 22 is described as having a convexity on the surface thereof as an example in the present embodiment, but may alternatively have no convexity on the surface thereof. The edge cover 22 is provided in the frame area and arranged in such a manner that the convex/concave shape thereof can restrain excessive spreading of liquid drops L that will form the organic film 28a in the scaling film 30a (detailed later) and that the organic film 28a can have a uniform thickness and a flat surface.

The organic light-emitting layers 23, one for each subpixel, are arranged in a matrix on the first electrodes 21 as shown in FIG. 4. Each organic light-emitting layer 23 includes a hole injection layer 1, a hole transport layer 2, a light-emitting layer 3, an electron transport layer 4, and an electron injection layer 5 provided sequentially on the first electrode 21 as shown in FIG. 5.

The hole injection layer 1, alternatively referred to as the anode buffer layer, has a function of bringing the energy levels of the first electrode 21 and the organic light-emitting layer 23 closer to each other to improve the efficiency of hole injection from the first electrode 21 to the organic light-emitting layer 23. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 has a function of improving the efficiency of hole transport from the first electrode 21 to the organic light-emitting layer 23. The hole transport layer 2 is made of, for example, a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 21 and the second electrode 24 respectively when the light-emitting layer 3 is under the voltage applied by the first electrode 21 and the second electrode 24. These injected holes and electrons recombine in the light-emitting layer 3. The light-emitting layer 3 is made of a material that has a high light-emitting efficiency. The light-emitting layer 3 is made of, for example, a metal oxynoid compound (8-hydroxy quinoline metal complex), a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis(styryl)benzene derivative, a tris(styryl)benzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxynoid compound.

The electron injection layer 5 has a function of bringing the energy levels of the second electrode 24 and the organic light-emitting layer 23 closer to each other to improve the efficiency of electron injection from the second electrode 24 to the organic light-emitting layer 23. This function can lower the drive voltage of the OLED 25. The electron injection layer 5 is alternatively referred to as the cathode buffer layer. The electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 24 serves as a cathode (common electrode) covering the organic light-emitting layer 23 and the edge cover 22 as shown in FIG. 4. The second electrode 24 has a function of injecting electrons to the organic light-emitting layer 23. The second electrode 24 is preferably formed of a material that has a small work function in order to improve the efficiency of electron injection to the organic light-emitting layer 23. The second electrode 24 is connected to a source conductive layer (wiring layer) 18h via the slit S formed in the planarization film 19a as shown in FIG. 4. The source conductive layer 18h is formed of the same material and in the same layer as the source electrodes 18a and 18c. The second electrode 24 is made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). Alternatively, the second electrode 24 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 24 may be made of, for example, an electrically conductive oxide such as tin oxide (SnO), zinc oxide (ZnO), indium tin oxide (ITO), or indium zinc oxide (IZO). As a further alternative, the second electrode 24 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 30a is provided in the display area D and the frame area F so as to cover the OLEDs 25 as shown in FIG. 4 and has a function of protecting the organic light-emitting layers 23 of the OLEDs 25 from, for example, water and oxygen. The sealing film 30a includes: a first inorganic film 26a provided so as to cover the OLEDs 25 (more specifically, the second electrodes 24, which provide the top layers of the OLEDs 25); a third inorganic film 27a on the first inorganic film 26a; the organic film 28a on the third inorganic film 27a; and a second inorganic film 29a on the organic film 28a, as shown in FIG. 4.

The first inorganic film 26a includes, for example, an inorganic insulating film such as a silicon nitride film. The first inorganic film 26a has a surface that exhibits relatively low wettability for the liquid drop L of the organic resin material that will form the organic film 28a (e.g., the contact angle θ is greater than or equal to 30°). The contact angle θ indicates wettability and is measured by the sessile drop method described in JIS R3257:1999. In the present embodiment, however, a CVD vapor deposition substrate C (see FIG. 6) is used in place of a glass substrate, and an ink material is used in place of water, in measuring the contact angle θ.

The third inorganic film 27a includes, for example, an inorganic insulating film such as a silicon oxide film. The third inorganic film 27a has a surface that exhibits relatively high wettability for the liquid drop L of the organic resin material that will form the organic film 28a (e.g., the contact angle θ is less than 30°). The third inorganic film 27a exhibits higher wettability for the liquid drop L than does the first inorganic film 26a. There is preferably a large difference between the contact angle θ on the surface of the first inorganic film 26a and the contact angle θ on the surface of the third inorganic film 27a. The third inorganic film 27a is located between the first inorganic film 26a and the organic film 28a as shown in FIGS. 1 and 4. The third inorganic film 27a has a peripheral end portion located inside of the peripheral end portion of the first inorganic film 26a (i.e., in the display area D side of the peripheral end portion of the first inorganic film 26a, or in FIG. 4, to the left of the peripheral end portion of the first inorganic film 26a) and outside of the peripheral end portion of the second electrode 24, which provides the top layer of the OLED 25 (i.e., opposite side of the peripheral end portion of the second electrode 24 from the display area D, or in FIG. 4, to the right of the peripheral end portion of the second electrode 24). The third inorganic film 27a has a peripheral end outside the slit S as shown in FIGS. 1 and 4 (i.e., the opposite side of the slit S from the display area D).

The organic film 28a is made of, for example, an organic resin material such as acrylate, epoxy, silicone, polyurea, parylene, polyimide, or polyamide. The organic film 28a is provided on the first inorganic film 26a so as to cover the third inorganic film 27a as shown in FIG. 4. The organic film 28a has a peripheral end portion inside of the peripheral end portion of the first inorganic film 26a (i.e., in the display area D side of the peripheral end portion of the first inorganic film 26a, or in FIG. 4, to the left of the peripheral end portion of the first inorganic film 26a) as shown in FIG. 4.

The second inorganic film 29a includes, for example, an inorganic insulating film such as a silicon nitride film, a silicon oxide film, or a silicon oxynitride film. The second inorganic film 29a is provided so as to cover the peripheral end portion of the first inorganic film 26a and to cover the organic film 28a as shown in FIG. 4.

The OLED display device 50a described above is arranged, in each subpixel P, to turn on the first TFT 9a by inputting a gate signal to the first TFT 9a via the gate line 14 and apply a prescribed voltage corresponding to a source signal to the gate electrode 14b and the capacitor 9c of the second TFT 9b via the source line 18f, to specify the magnitude of the current from the power supply line 18g on the basis of the gate voltage of the second TFT 9b, so that the specified current is fed to the organic light-emitting layer 23, thereby causing the light-emitting layer 3 in the organic light-emitting layer 23 to emit light to display an image. In the OLED display device 50a, the gate voltage of the second TFT 9b is retained by the capacitor 9c even if the first TFT 9a is turned off. The light-emitting layer 3 therefore continuously emits light until a gate signal is inputted in the next frame.

Next will be described a method of manufacturing the OLED display device 50a in accordance with the present embodiment. The method of manufacturing the OLED display device 50a in accordance with the present embodiment includes: a TFT layer forming step; an OLED forming step (light-emitting element forming step); and a sealing film forming step including a first inorganic film forming step, a third inorganic film forming step, an organic film forming step, and a second inorganic film forming step.

TFT Layer Forming Step

The TFT layer 20a is formed, for example, by forming the base coat film 11, the first TFTs 9a, the second TFTs 9b, the capacitors 9c, and the planarization film 19a on a surface of the resin substrate layer 10 on a glass substrate by a well-known method.

OLED Forming Step

The OLEDs 25 are formed by forming the first electrodes 21, the edge cover 22, the organic light-emitting layers 23 (the hole injection layer 1, the hole transport layer 2, the light-emitting layer 3, the electron transport layer 4, and the electron injection layer 5), and the second electrodes 24 on the TFT layer 20a formed in the TFT layer forming step by a well-known method.

Sealing Film Forming Step

First, for example, an inorganic insulating film such as a silicon nitride film is formed by plasma CVD using a mask to a thickness of approximately 1,000 nm on the surface of the substrate now carrying the OLEDs 25 formed thereon in the OLED forming step, to form the first inorganic film 26a (first inorganic film forming step).

Subsequently, for example, an inorganic insulating film such as a silicon oxide film is formed by plasma CVD using a mask to a thickness of approximately 100 nm on the surface of the substrate now carrying the first inorganic layer 26a thereon, to form the third inorganic film 27a (third inorganic film forming step).

An ultraviolet-curing organic resin material such as acrylate is then applied and leveled, for example, by inkjet technology to a thickness of approximately 10 μm on the surface of the substrate now carrying the third inorganic film 27a thereon. Thereafter, the material is cured under ultraviolet light to form the organic film 28a (organic film forming step). The liquid drop L wets and spreads well on the surface of the third inorganic film 27a and poorly on the surface of the first inorganic film 26a because of the difference in wettability between the first inorganic film 26a and the third inorganic film 27a for the liquid drop L. This mechanism makes it more likely that the liquid drop L stops wetting and spreading on the surface of the first inorganic film 26a that is exposed out of the third inorganic film 27a. The peripheral end portion of the organic film 28a is hence located inside of the peripheral end portion of the first inorganic film 26a (i.e., in the display area D side of the peripheral end portion of the first inorganic film 26a, or in FIG. 4, to the left of the peripheral end portion of the first inorganic film 26a) as shown in FIG. 4.

Then, for example, an inorganic insulating film such as a silicon nitride film, a silicon oxide film, or a silicon oxynitride film is formed by plasma CVD using a mask to a thickness of approximately 1,000 nm on the substrate now carrying the organic film 28a thereon, to form the second inorganic film 29a. The sealing film 30a is thus formed in which the first inorganic film 26a, the third inorganic film 27a, the organic film 28a, and the second inorganic film 29a are sequentially stacked (second inorganic film forming step).

Finally, a laser beam irradiates the bottom side of the substrate (glass substrate) carrying the sealing film 30a thereon, to detach the glass substrate from the bottom face of the resin substrate layer 10.

The OLED display device 50a in accordance with the present embodiment is manufactured by these steps.

As described in the foregoing, according to the OLED display device 50a and the method of manufacturing the OLED display device 50a in accordance with the present embodiment, the third inorganic film forming step forms the third inorganic film 27a on the first inorganic film 26a formed in the first inorganic film forming step such that the third inorganic film 27a has a peripheral end portion located inside of the peripheral end portion of the first inorganic film 26a and outside of the peripheral end portion of the OLED 25 and that the third inorganic film 27a exhibits higher wettability for the liquid drop L that will form the organic film 28a than does the first inorganic film 26a. Therefore, in the later, organic film forming step when the organic film 28a is formed by inkjet technology on the first inorganic film 26a so as to cover the third inorganic film 27a, the liquid drop L that will form the organic film 28a wets and spreads well on the surface of the third inorganic film 27a and poorly on the surface of the first inorganic film 26a. This mechanism makes it more likely that the liquid drop L stops wetting and spreading on the surface of the first inorganic film 26a that is exposed out of the third inorganic film 27a, thereby accurately forming the peripheral end portion of the organic film 28a, which is a part of the sealing film 30a. Additionally, with the peripheral end portion of the organic film 28a being located inside of the peripheral end portion of the first inorganic film 26a and outside of the peripheral end portion of the third inorganic film 27a, the second inorganic film forming step forms the second inorganic film 29a so as to cover the peripheral end portion of the first inorganic film 26a and to cover the organic film 28a, thereby forming the sealing film 30a the sealing capability of which is guaranteed. No damming structural elements for damming up the liquid drop L are needed in the frame area F where the peripheral end portion of the sealing film 30a is located. The frame area F can thereby be reduced in width.

According to the OLED display device 50a and the method of manufacturing the OLED display device 50a in accordance with the present embodiment, the OLEDs 25 have non-flat surfaces because of the presence of the edge cover 22. These non-flat surfaces restrain the wetting and spreading of the liquid drop L in the display area D.

Second Embodiment

Figure 7:
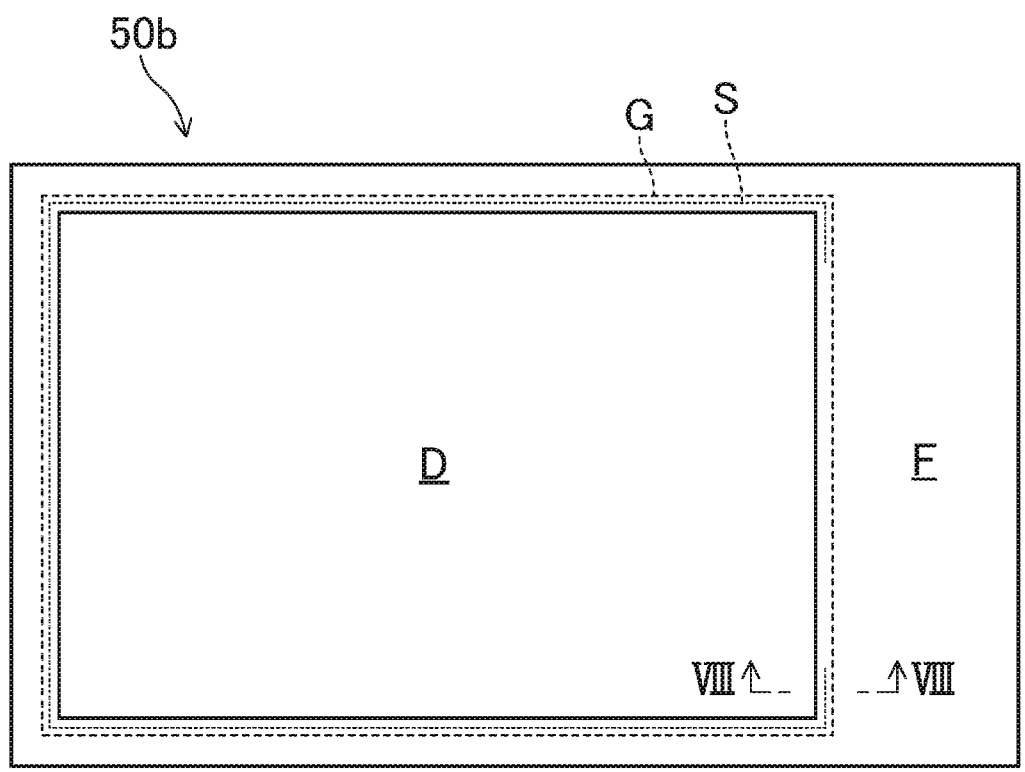
FIG. 7 is a schematic plan view of a structure of an OLED display device in accordance with a second embodiment of the disclosure.
Figure 8:
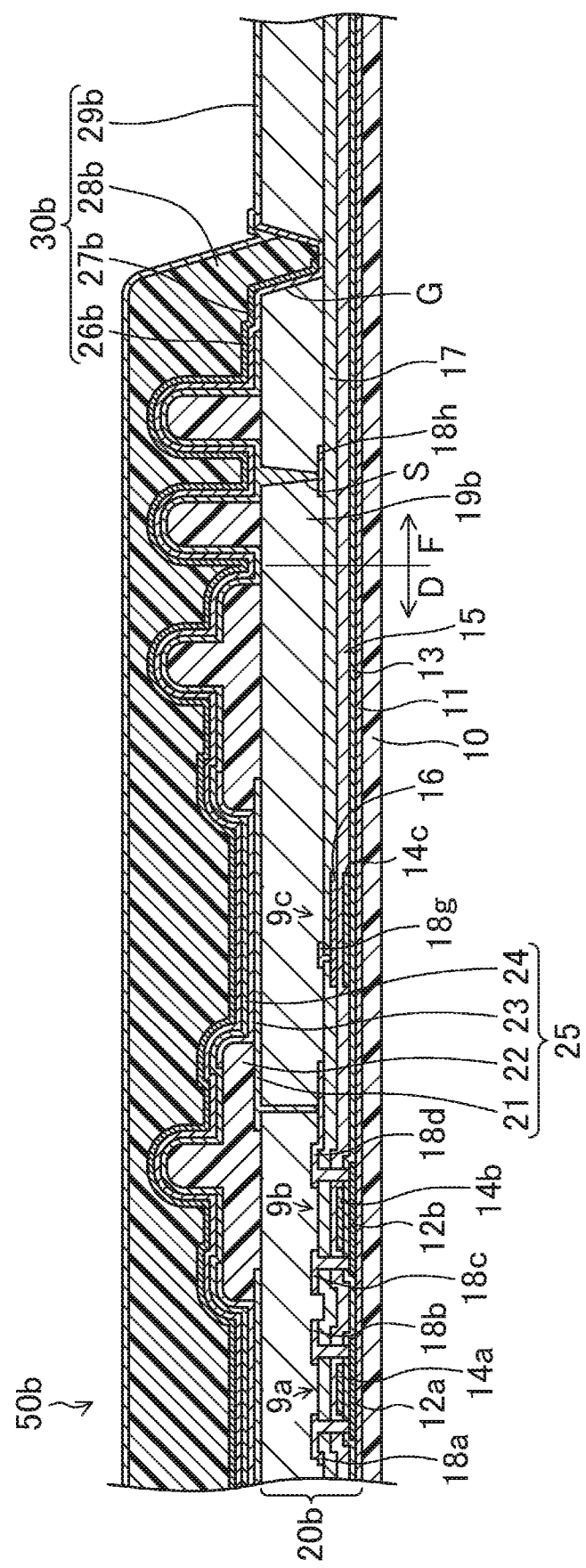
FIG. 8 is a cross-sectional view of the OLED display device taken along line VIII-VIII shown in FIG. 7.
Figure 9:
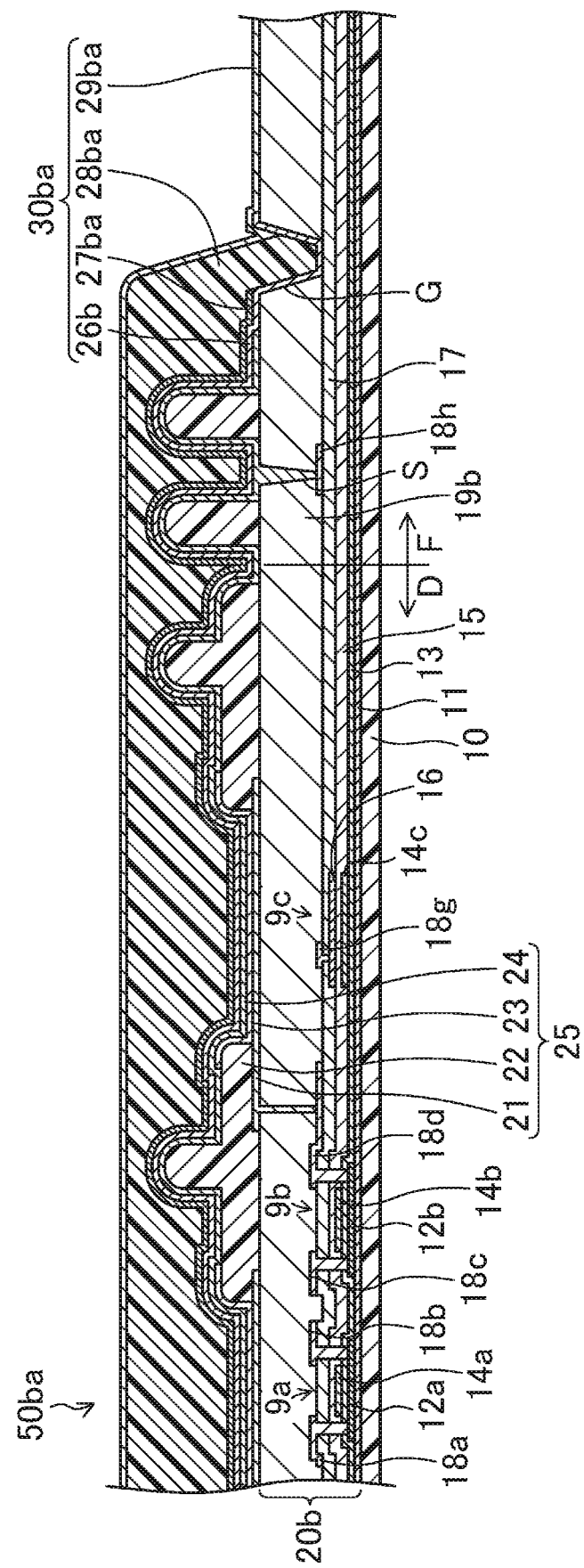
FIG. 9 is a cross-sectional view of a variation example of the OLED display device in accordance with the second embodiment of the disclosure.

FIGS. 7 to 9 illustrate a second embodiment of the display device and the method of manufacturing the display device in accordance with the disclosure. FIG. 7 is a schematic plan view of a structure of an OLED display device 50b in accordance with the present embodiment. FIG. 8 is a cross-sectional view of the OLED display device 50b taken along line VIII-VIII shown in FIG. 7. FIG. 9 is a cross-sectional view of an OLED display device 50ba that is a variation example of the OLED display device 50b. Members of this and subsequent embodiments that are the same as those shown in FIGS. 1 to 6 are indicated by the same reference signs or numerals, and detailed description thereof is omitted.

The first embodiment discussed, as an example, the OLED display device 50a including no damming structural elements for damming up the liquid drop L. The present embodiment discusses, as an example, the OLED display device 50b including a damming groove G as a damming structural element in the frame area F.

The OLED display device 50b, as shown in FIG. 7, includes a rectangular display area D for displaying an image and a frame area F surrounding the display area D.

The OLED display device 50b, as shown in FIG. 8, includes a resin substrate layer 10, a TFT layer 20b, OLEDs 25, and a sealing film 30b. The resin substrate layer 10 serves as a base substrate. The TFT layer 20b is provided on the resin substrate layer 10. The OLEDs 25 are light-emitting elements on the TFT layer 20b. The sealing film 30b is provided so as to cover the OLEDs 25.

The TFT layer 20b includes: a base coat film 11 on the resin substrate layer 10; a plurality of first TFTs 9a, a plurality of second TFTs 9b, and a plurality of capacitors 9c on the base coat film 11; and a planarization film 19b on the first TFTs 9a, the second TFTs 9b, and the capacitors 9c, as shown in FIG. 8. Similarly to the TFT layer 20a of the first embodiment, the TFT layer 20b includes therein a plurality of gate lines 14 extending parallel to each other. The TFT layer 20b, similarly to the TFT layer 20a of the first embodiment, includes therein a plurality of source lines 18f extending parallel to each other in the direction perpendicular to the gate lines 14. The TFT layer 20b, similarly to the TFT layer 20a of the first embodiment, further includes therein a plurality of power supply lines 18g extending parallel to each other and adjacent to the source lines 18f. The TFT layer 20b, similarly to the TFT layer 20a of the first embodiment, further includes therein the first TFTs 9a, the second TFTs 9b, and the capacitors 9c, one each in every subpixel P.

The planarization film 19b is made of, for example, a colorless, transparent organic resin material such as polyimide resin. The planarization film 19b has a generally U-shaped slit S and a continuous, frame-shaped damming groove G provided sequentially from the display area D side so as to surround the display area D in the frame area F as shown in FIGS. 7 and 8.

The sealing film 30b is provided in the display area D and the frame area F so as to cover the OLEDs 25 as shown in FIG. 8 and has a function of protecting the organic light-emitting layers 23 of the OLEDs 25 from, for example, water and oxygen. The sealing film 30b includes: a first inorganic film 26b provided so as to cover the OLEDs 25 (more specifically, the second electrodes 24, which provide the top layers of the OLEDs 25); a third inorganic film 27b on the first inorganic film 26b; an organic film 28b on the third inorganic film 27b; and a second inorganic film 29b on the organic film 28b, as shown in FIG. 8.

The first inorganic film 26b includes, for example, an inorganic insulating film such as a silicon nitride film. The first inorganic film 26b has a surface that exhibits relatively low wettability for the liquid drop L of the organic resin material that will form the organic film 28b (e.g., the contact angle θ is greater than or equal to 30°). The first inorganic film 26b is provided reaching the internal surface of the damming groove G formed in the planarization film 19b as shown in FIG. 8.

The third inorganic film 27b includes, for example, an inorganic insulating film such as a silicon oxide film. The third inorganic film 27b has a surface that exhibits relatively high wettability for the liquid drop L of the organic resin material that will form the organic film 28b (e.g., the contact angle θ is less than 30°). The third inorganic film 27b exhibits higher wettability for the liquid drop L than does the first inorganic film 26b. There is preferably a large difference between the contact angle θ on the surface of the first inorganic film 26b and the contact angle θ on the surface of the third inorganic film 27b. The third inorganic film 27b is located between the first inorganic film 26b and the organic film 28b as shown in FIG. 8. The third inorganic film 27b has peripheral end portion inside of the peripheral end portion of the first inorganic film 26b (i.e., in the display area D side of the peripheral end portion of the first inorganic film 26b, or in FIG. 8, to the left of the peripheral end portion of the first inorganic film 26b) and outside of the peripheral end portion of the second electrode 24, which provides the top layer of the OLED 25 (i.e., opposite side of the peripheral end portion of the second electrode 24 from the display area D, or in FIG. 8, to the right of the peripheral end portion of the second electrode 24).

The present embodiment has discussed the structure of the sealing film 30b in which the third inorganic film 27b is provided reaching the bottom portion of the damming groove G FIG. 9 shows an alternative structure including a sealing film 30ba. The OLED display device 50ba, structured including the sealing film 30ba, includes: a third inorganic film 27ba, which is an equivalent of the third inorganic film 27b, provided reaching the display area D side rim of the damming groove G; and an organic film 28ba, which is an equivalent of the organic film 28b, and a second inorganic film 29ba, which is an equivalent of the second inorganic film 29b, sequentially stacked on the third inorganic film 27ba, as shown in FIG. 9.

The organic film 28b is made of, for example, an organic resin material such as acrylate, epoxy, silicone, polyurea, parylene, polyimide, or polyamide. The organic film 28b is provided on the first inorganic film 26b so as to cover the third inorganic film 27b as shown in FIG. 8. The organic film 28b has a peripheral end portion extended to the inside of the damming groove G and located inside of the peripheral end portion of the first inorganic film 26b (i.e., in the display area D side of the peripheral end portion of the first inorganic film 26b, or in FIG. 8, to the left of the peripheral end portion of the first inorganic film 26b), as shown in FIG. 8.

The second inorganic film 29b includes, for example, an inorganic insulating film such as a silicon nitride film, a silicon oxide film, or a silicon oxynitride film. The second inorganic film 29b is provided so as to cover the peripheral end portion of the first inorganic film 26b and to cover the organic film 28b as shown in FIG. 8.

Similarly to the OLED display device 50a of the first embodiment, the OLED display device 50b described above is flexible and arranged in each subpixel P such that the light-emitting layer 3 in the organic light-emitting layer 23 emits light via the first TFT 9a and the second TFT 9b in a suitable manner, thereby displaying an image.

The OLED display device 50b in accordance with the present embodiment can be manufactured by the method of manufacturing the OLED display device 50a described in the first embodiment, by making some changes to the shape of the pattern for the planarization film 19a.

As described in the foregoing, according to the OLED display device 50b and the method of manufacturing the OLED display device 50b in accordance with the present embodiment, the third inorganic film forming step forms the third inorganic film 27b on the first inorganic film 26b formed in the first inorganic film forming step such that the third inorganic film 27b has a peripheral end portion located inside of the peripheral end portion of the first inorganic film 26b and outside of the peripheral end portion of the OLED 25 and that the third inorganic film 27b exhibits higher wettability for the liquid drop L that will form the organic film 28b than does the first inorganic film 26b. Therefore, in the later, organic film forming step when the organic film 28b is formed by inkjet technology on the first inorganic film 26b so as to cover the third inorganic film 27b, the liquid drop L that will form the organic film 28b wets and spreads well on the surface of the third inorganic film 27b and poorly on the surface of the first inorganic film 26b. This mechanism makes it more likely that the liquid drop L stops wetting and spreading on the surface of the first inorganic film 26b that is exposed out of the third inorganic film 27b, thereby accurately forming the peripheral end portion of the organic film 28b, which is a part of the scaling film 30b. Additionally, with the peripheral end portion of the organic film 28b being located inside of the peripheral end portion of the first inorganic film 26b and outside of the peripheral end portion of the third inorganic film 27b, the second inorganic film forming step forms the second inorganic film 29b so as to cover the peripheral end portion of the first inorganic film 26b and to cover the organic film 28b, thereby forming the sealing film 30b the sealing capability of which is guaranteed.

According to the OLED display device 50b and the method of manufacturing the OLED display device 50b in accordance with the present embodiment, the OLEDs 25 have non-flat surfaces because of the presence of the edge cover 22. These non-flat surfaces restrain the wetting and spreading of the liquid drop L in the display area D.

According to the OLED display device 50b and the method of manufacturing the OLED display device 50b in accordance with the present embodiment, the frame area F has the damming groove G surrounding the display area D, and the first inorganic film 26b is provided reaching the internal surface of the damming groove G. Therefore, in the organic film forming step, the liquid drop L that will form the organic film 28b falls into the inside of the damming groove G, so that the liquid drop L can be reliably dammed up.

Third Embodiment

Figure 10:
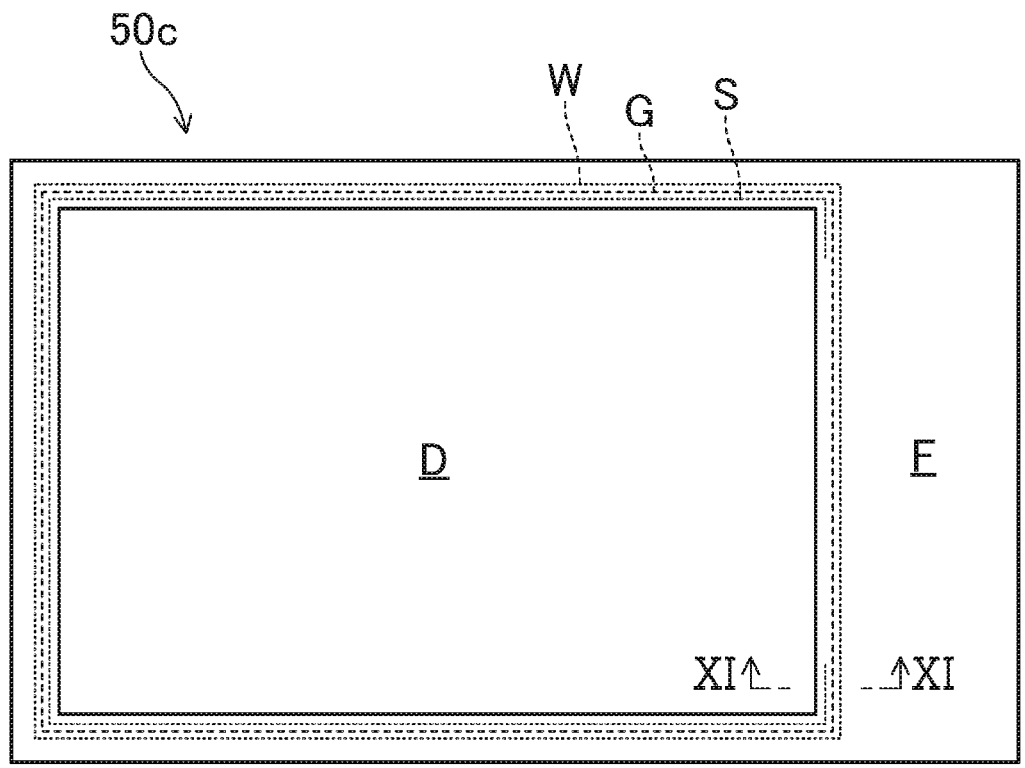
FIG. 10 is a schematic plan view of a structure of an OLED display device in accordance with a third embodiment of the disclosure.
Figure 11:
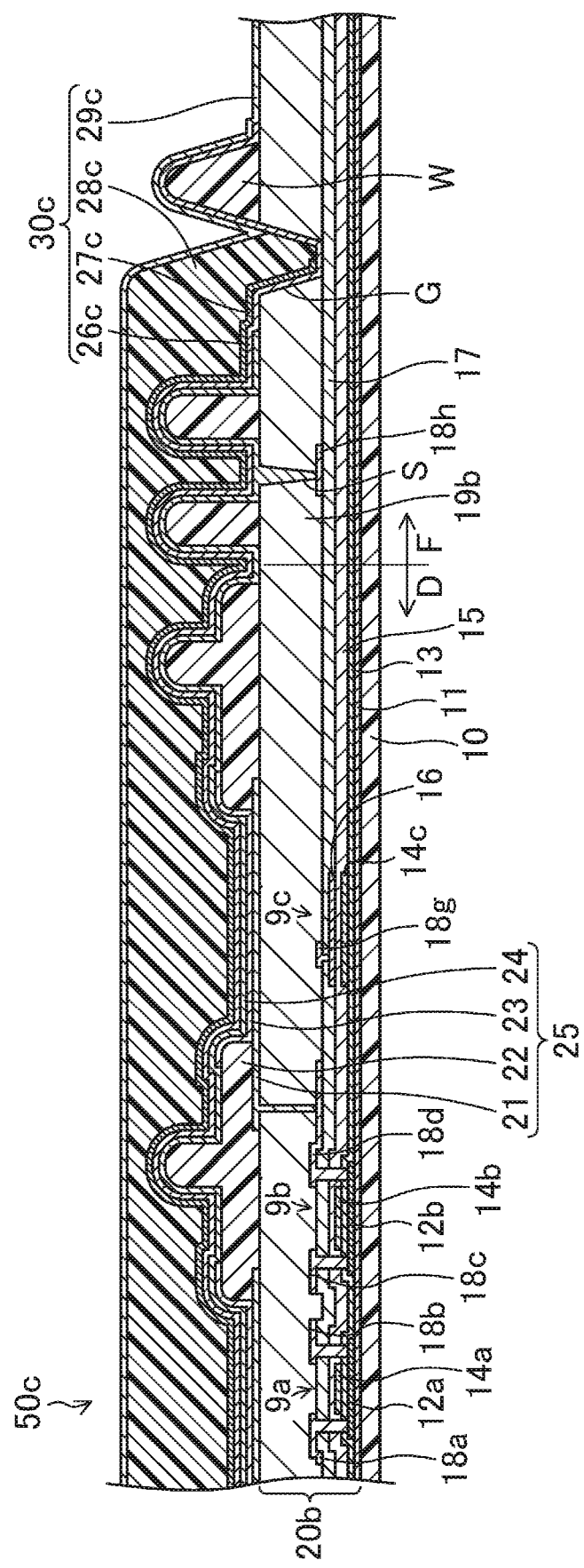
FIG. 11 is a cross-sectional view of the OLED display device taken along line XI-XI shown in FIG. 10.

FIGS. 10 and 11 illustrate a third embodiment of the display device and the method of manufacturing the display device in accordance with the disclosure. FIG. 10 is a schematic plan view of a structure of an OLED display device 50c in accordance with the present embodiment. FIG. 11 is a cross-sectional view of the OLED display device 50c taken along line XI-XI shown in FIG. 10.

The second embodiment discussed, as an example, the OLED display device 50b including the damming groove G as a damming structural element in the frame area F. The present embodiment discusses, as an example, the OLED display device 50c including the damming groove G and a damming wall W as damming structural elements in the frame area F.

The OLED display device 50c, as shown in FIG. 10, includes a rectangular display area D for displaying an image and a frame area F surrounding the display area D.

The OLED display device 50c, as shown in FIG. 11, includes a resin substrate layer 10, a TFT layer 20b, OLEDs 25, and a sealing film 30c. The resin substrate layer 10 serves as a base substrate. The TFT layer 20b is provided on the resin substrate layer 10. The OLEDs 25 are light-emitting elements on the TFT layer 20b. The sealing film 30c is provided so as to cover the OLEDs 25.

The OLED display device 50c includes, in the frame area F thereof, the frame-shaped damming wall W outside of the damming groove G formed in the planarization film 19b (i.e., the display area D side of the damming groove G formed in the planarization film 19b) as shown in FIGS. 10 and 11. The frame-shaped damming wall W surrounds the damming groove G. The damming wall W is formed of the same material and in the same layer as the edge cover 22.

The sealing film 30c is provided in the display area D and the frame area F so as to cover the OLEDs 25 as shown in FIG. 11 and has a function of protecting the organic light-emitting layers 23 of the OLEDs 25 from, for example, water and oxygen. The sealing film 30c includes: a first inorganic film 26c provided so as to cover the OLEDs 25 (more specifically, the second electrodes 24, which provide the top layers of the OLEDs 25); a third inorganic film 27c on the first inorganic film 26c; an organic film 28c on the third inorganic film 27c; and a second inorganic film 29c on the organic film 28c, as shown in FIG. 11.

The first inorganic film 26c includes, for example, an inorganic insulating film such as a silicon nitride film. The first inorganic film 26c has a surface that exhibits relatively low wettability for the liquid drop L of the organic resin material that will form the organic film 28b (e.g., the contact angle θ is greater than or equal to 30°). The first inorganic film 26c is provided reaching the internal surface of the damming groove G formed in the planarization film 19b and reaching the surface of the damming wall W as shown in FIG. 11.

The third inorganic film 27c includes, for example, an inorganic insulating film such as a silicon oxide film. The third inorganic film 27c has a surface that exhibits relatively high wettability for the liquid drop L of the organic resin material that will form the organic film 28c (e.g., the contact angle θ is less than 30°). The third inorganic film 27c exhibits higher wettability for the liquid drop L than does the first inorganic film 26c. There is preferably a large difference between the contact angle θ on the surface of the first inorganic film 26c and the contact angle θ on the surface of the third inorganic film 27c. The third inorganic film 27c is located between the first inorganic film 26c and the organic film 28c as shown in FIG. 11. The third inorganic film 27c has a peripheral end portion located inside of the peripheral end portion of the first inorganic film 26c (i.e., in the display area D side of the peripheral end portion of the first inorganic film 26c, or in FIG. 11, to the left of the peripheral end portion of the first inorganic film 26c) and outside of the peripheral end portion of the second electrode 24, which provides the top layer of the OLED 25 (i.e., opposite side of the peripheral end portion of the second electrode 24 from the display area D, or in FIG. 11, to the right of the peripheral end portion of the second electrode 24).

The organic film 28c is made of, for example, an organic resin material such as acrylate, epoxy, silicone, polyurea, parylene, polyimide, or polyamide. The organic film 28c is provided on the first inorganic film 26c so as to cover the third inorganic film 27c as shown in FIG. 11. The organic film 28c has a peripheral end portion extended to the inside of the damming groove G, brought into contact with one of the side faces of the damming wall W that is closer to the display area D via the first inorganic film 26c, and located inside of the peripheral end portion of the first inorganic film 26c (the display area D side of the peripheral end portion of the first inorganic film 26c, or in FIG. 11, to the left of the peripheral end portion of the first inorganic film 26c), as shown in FIG. 11.

The second inorganic film 29c includes, for example, an inorganic insulating film such as a silicon nitride film, a silicon oxide film, or a silicon oxynitride film. The second inorganic film 29c is provided so as to cover the peripheral end portion of the first inorganic film 26c and to cover the organic film 28c as shown in FIG. 11.

Similarly to the OLED display device 50a of the first embodiment, the OLED display device 50c described above is flexible and arranged in each subpixel P such that the light-emitting layer 3 in the organic light-emitting layer 23 emits light via the first TFT 9a and the second TFT 9b in a suitable manner, thereby displaying an image.

The OLED display device 50c in accordance with the present embodiment can be manufactured by the method of manufacturing the OLED display device 50a described in the first embodiment, by making some changes to the shape of the pattern for the planarization film 19a and forming the damming wall W in forming the edge cover 22.

As described in the foregoing, according to the OLED display device 50c and the method of manufacturing the OLED display device 50c in accordance with the present embodiment, the third inorganic film forming step forms the third inorganic film 27c on the first inorganic film 26c formed in the first inorganic film forming step such that the third inorganic film 27c has a peripheral end portion located inside of the peripheral end portion of the first inorganic film 26c and outside of the peripheral end portion of the OLED 25 and that the third inorganic film 27c exhibits higher wettability for the liquid drop L that will form the organic film 28c than does the first inorganic film 26c. Therefore, in the later, organic film forming step when the organic film 28c is formed by inkjet technology on the first inorganic film 26c so as to cover the third inorganic film 27c, the liquid drop L that will form the organic film 28c wets and spreads well on the surface of the third inorganic film 27c and poorly on the surface of the first inorganic film 26c. This mechanism makes it more likely that the liquid drop L stops wetting and spreading on the surface of the first inorganic film 26c that is exposed out of the third inorganic film 27c, thereby accurately forming the peripheral end portion of the organic film 28c, which is a part of the sealing film 30c. Additionally, with the peripheral end portion of the organic film 28c being located inside of the peripheral end portion of the first inorganic film 26c and outside of the peripheral end portion of the third inorganic film 27c, the second inorganic film forming step forms the second inorganic film 29c so as to cover the peripheral end portion of the first inorganic film 26c and to cover the organic film 28c, thereby forming the sealing film 30c the sealing capability of which is guaranteed.

According to the OLED display device 50c and the method of manufacturing the OLED display device 50c in accordance with the present embodiment, the OLEDs 25 have non-flat surfaces because of the presence of the edge cover 22. These non-flat surfaces restrain the wetting and spreading of the liquid drop L in the display area D.

According to the OLED display device 50c and the method of manufacturing the OLED display device 50c in accordance with the present embodiment, the frame area F has the damming groove G surrounding the display area D, and the first inorganic film 26a is provided reaching the internal surface of the damming groove G. Therefore, in the organic film forming step, the liquid drop L that will form the organic film 28b falls into the inside of the damming groove G, so that the liquid drop L can be reliably dammed up. Additionally, the damming wall W is provided outside of the damming groove G so as to surround the damming groove G, and the organic film 28c has a peripheral end portion in contact with one of the side faces of the damming wall W that is closer to the display area D via the first inorganic film 26c. This particular structure causes the liquid drop L falling into the inside of the damming groove G to hit one of the side faces of the damming wall W that is closer to the display area D in the organic film forming step, so that the liquid drop L can be more reliably dammed up.

Other Embodiments

The embodiments have so far discussed an example where the organic light-emitting layer includes a stack of five layers: a hole injection layer, a hole transport layer, a light-emitting layer, an electron transport layer, and an electron injection layer. Alternatively, the organic light-emitting layer may include, for example, a stack of three layers: a hole injection and transport layer, a light-emitting layer, and an electron transport and injection layer.

The embodiments have so far discussed an example where the OLED display device includes the first electrodes serving as anodes and the second electrodes serving as cathodes. The disclosure is applicable also to an OLED display device in which the layer structure of the organic light-emitting layer is reversed so that the first electrodes serve as cathodes and the second electrodes serve as anodes.

The embodiments have so far discussed an example where the OLED display device includes an element substrate where the electrode of the TFT connected to the first electrode serves as the drain electrode. The disclosure is applicable also to an OLED display device including an element substrate where the electrode of the TFT connected to the first electrode serves as the source electrode.

The embodiments have so far discussed the OLED display device as an exemplary display device. The disclosure is applicable to any display device including a plurality of current-driven light-emitting elements, for instance, to a display device including QLEDs (quantum-dot light emitting diodes) which are light-emitting elements including a quantum dot layer.

INDUSTRIAL APPLICABILITY

As described above, the disclosure is useful in flexible display devices.

REFERENCE SIGNS LIST

D Display Area
F Frame Area
G Damming Groove
L Liquid Drop
S Slit
W Damming Wall
10 Resin Substrate Layer (Base Substrate)
18h Source Conductive Layer (Wiring Layer)
19a, 19b Planarization Film
20a, 20b TFT Layer
22 Edge Cover
24 Second Electrode (Common Electrode)
25 OLED (light-emitting element)
26a to 26c First Inorganic Film
27a to 27c, 27ba Third Inorganic Film
28a to 28c, 28ba Organic Film
29a to 29c, 29ba Second Inorganic Film
30a to 30c, 30ba Sealing Film
50a to 50c, 50ba OLED Display Device

The invention claimed is:

1. A display device comprising:
a base substrate having designated a display area and a frame area, the display area being configured to display an image, the frame area surrounding the display area;
a light-emitting element in the display area of the base substrate; and
a sealing film provided in the display area and the frame area so as to cover the light-emitting element, the sealing film including a sequential stack of a first inorganic film, an organic film, and a second inorganic film, wherein
the first inorganic film is provided so as to cover the light-emitting element,
the display device further comprises a third inorganic film between the first inorganic film and the organic film, the third inorganic film having higher wettability for a liquid drop that is to form the organic film than does the first inorganic film and having a peripheral end portion located on a display area side of a peripheral end portion of the first inorganic film and on an opposite side of a peripheral end portion of the light-emitting element from the display area, wherein the peripheral end portion of the first inorganic film is exposed from the peripheral end portion of the third inorganic film,
the organic film is provided on the first inorganic film so as to cover the third inorganic film, and
the second inorganic film is provided so as to cover the peripheral end portion of the first inorganic film and to cover the organic film.

2. The display device according to claim 1, further comprising a TFT layer between the base substrate and the light-emitting element, wherein
the TFT layer includes a wiring layer and a planarization film on the wiring layer,
the light-emitting element includes a common electrode, the planarization film has a slit in the frame area along a boundary with the display area, the common electrode is electrically connected to the wiring layer via the slit, and the peripheral end portion of the third inorganic film is located on an opposite side of the slit from the display area.

3. The display device according to claim 2, wherein the frame area has a frame-shaped damming groove formed therein so as to surround the display area, and the first inorganic film is provided reaching an internal surface of the damming groove so as to surround the damming groove.

4. The display device according to claim 3, wherein the third inorganic film is provided reaching a display area side edge of the damming groove.

5. The display device according to claim 3, wherein the third inorganic film is provided reaching a bottom portion of the damming groove.

6. The display device according to claim 3, wherein the damming groove is formed in the planarization film.

7. The display device according to claim 3, further comprising a damming wall provided on an opposite side of the damming groove from the display area so as to surround the damming groove, wherein the organic film has a peripheral end portion in contact with one of side faces of the damming wall that is closer to the display area via the first inorganic film.

8. The display device according to claim 7, wherein the light-emitting element includes an edge cover, and the damming wall is formed of a same material and in a same layer as the edge cover.

9. The display device according to claim 1, wherein the light-emitting element has a non-flat surface.

10. The display device according to claim 1, wherein the light-emitting element is an organic light-emitting diode.

11. A method of manufacturing a display device, the method comprising:

a light-emitting element forming step of forming a light-emitting element in a display area of a base substrate having designated the display area and a frame area, the display area being configured to display an image, the frame area surrounding the display area; and a sealing film forming step of forming a sealing film in the display area and the frame area so as to cover the light-emitting element, the sealing film including a sequential stack of a first inorganic film, an organic film, and a second inorganic film, the sealing film forming step comprising:

a first inorganic film forming step of forming the first inorganic film so as to cover the light-emitting element;

a third inorganic film forming step of forming a third inorganic film on the first inorganic film such that the third inorganic film has higher wettability for a liquid drop that is to form the organic film than does the first inorganic film and has a peripheral end portion located on a display area side of a peripheral end portion of the first inorganic film and on an opposite side of a peripheral end portion of the light-emitting element from the display area, wherein the peripheral end portion of the first inorganic film is exposed from the peripheral end portion of the third inorganic film;

an organic film forming step of forming the organic film on the first inorganic film by inkjet technology so as to cover the third inorganic film; and a second inorganic film forming step of forming the second inorganic film so as to cover the peripheral end portion of the first inorganic film and to cover the organic film.

12. The method according to claim 11, wherein the light-emitting element is an organic light-emitting diode.

* * * * *